United States Patent
Yi et al.

(10) Patent No.: US 9,049,802 B2
(45) Date of Patent: Jun. 2, 2015

(54) APPARATUS FOR RECEIVING SERVERS

(71) Applicants: HONG FU JIN PRECISION INDUSTRY (ShenZhen) CO., LTD.., Shenzhen (CN); HON HAI PRECISION INDUSTRY CO., LTD., New Taipei (TW)

(72) Inventors: Shu-Ni Yi, Shenzhen (CN); Hung-Yi Wu, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 176 days.

(21) Appl. No.: 13/674,958

(22) Filed: Nov. 13, 2012

(65) Prior Publication Data
US 2013/0242503 A1     Sep. 19, 2013

(30) Foreign Application Priority Data
Mar. 15, 2012   (CN) .......................... 2012 1 0067658

(51) Int. Cl.
 H05K 7/20    (2006.01)
 H05K 7/14    (2006.01)
 H01L 23/473  (2006.01)

(52) U.S. Cl.
 CPC ........ *H05K 7/20709* (2013.01); *H05K 7/20145* (2013.01); *H05K 7/20718* (2013.01); *H05K 7/1489* (2013.01)

(58) Field of Classification Search
 CPC ............. H05K 7/20; H05K 7/20218–7/20381; H01L 23/473
 USPC ................................ 361/688–703, 704–723, 361/679.46–679.54, 724–727; 165/80.1–80.5, 104.33, 185; 174/15.1–15.2, 16.1–16.3, 521, 526, 174/547–548; 454/184; 248/165; 211/26
 See application file for complete search history.

(56) References Cited

U.S. PATENT DOCUMENTS

| | | | | |
|---|---|---|---|---|
| 5,640,303 | A * | 6/1997 | Hooley | 361/699 |
| 6,310,783 | B1 * | 10/2001 | Winch et al. | 361/797 |
| 7,408,772 | B2 * | 8/2008 | Grady et al. | 361/679.48 |
| 7,855,885 | B2 * | 12/2010 | Adducci et al. | 361/692 |
| 7,907,402 | B2 * | 3/2011 | Caveney | 361/694 |
| 7,983,039 | B1 * | 7/2011 | Nguyen et al. | 361/695 |
| 8,089,754 | B2 * | 1/2012 | Peng et al. | 361/679.48 |
| 8,395,046 | B2 * | 3/2013 | Nicewicz et al. | 174/50 |
| 8,400,765 | B2 * | 3/2013 | Ross | 361/679.33 |
| 8,477,491 | B1 * | 7/2013 | Ross et al. | 361/679.5 |
| 8,526,181 | B2 * | 9/2013 | Levesque et al. | 361/690 |
| 8,654,532 | B2 * | 2/2014 | Chen et al. | 361/701 |
| 8,773,853 | B2 * | 7/2014 | Tsai et al. | 361/695 |
| 2005/0227608 | A1 * | 10/2005 | Wu et al. | 454/184 |
| 2006/0044758 | A1 * | 3/2006 | Spangberg | 361/695 |
| 2008/0043426 | A1 * | 2/2008 | Nishiyama et al. | 361/687 |
| 2008/0151496 | A1 * | 6/2008 | Lai et al. | 361/695 |

(Continued)

*Primary Examiner* — Michael Datskovsky
*Assistant Examiner* — Razmeen Gafur
(74) *Attorney, Agent, or Firm* — Novak Druce Connolly Bove + Quigg LLP

(57) ABSTRACT

An apparatus includes a server cabinet configured to receive a plurality of servers therein, and a single heat dissipation device mounted on the server cabinet and positioned outside of the plurality of servers. The heat dissipation device includes a plurality of fans, and each of the plurality of fans is configured to dissipate heat generated in the overall server cabinet.

13 Claims, 4 Drawing Sheets

(56) References Cited

U.S. PATENT DOCUMENTS

| | | |
|---|---|---|
| 2009/0237877 A1* | 9/2009 | Honda et al. .............. 361/679.39 |
| 2009/0284919 A1* | 11/2009 | Tao et al. ...................... 361/695 |
| 2010/0321874 A1* | 12/2010 | Bhattacharyya et al. .. 361/679.5 |
| 2011/0013359 A1* | 1/2011 | Goldrian et al. .......... 361/679.54 |
| 2011/0096501 A1* | 4/2011 | Li et al. .......................... 361/697 |
| 2011/0250831 A1* | 10/2011 | Huang et al. ................... 454/184 |
| 2011/0255237 A1* | 10/2011 | Doll ........................ 361/679.46 |
| 2011/0279976 A1* | 11/2011 | Mikami et al. ................ 361/696 |

* cited by examiner

APPARATUS FOR RECEIVING SERVERS

BACKGROUND

1. Technical Field

The present disclosure relates to computer server systems, and particularly to an apparatus for receiving a plurality of servers.

2. Description of Related Art

A computer system can employ a plurality of servers to enhance data processing capability. For example, a common four-in-one server computer system includes four servers. All of the servers can be received in one server cabinet and share one hard disk backboard that is electrically connected to hard disk drives.

In use, heat generated in the servers needs to be quickly dissipated. In most multi-server computer systems, each of the servers is equipped with at least one exclusive fan for heat dissipation. However, this results in a large number of fans and the spending of much electrical power. Furthermore, because the fans are generally received inside cases of the servers, if any one of the fans requires repair or exchange, the server receiving the fan and the cabinet receiving all of the servers may need to be disassembled. The disassembly operation involves much labor and inefficiency.

Therefore, there is room for improvement within the art.

BRIEF DESCRIPTION OF THE DRAWINGS

Many aspects of the present disclosure can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the figure.

DETAILED DESCRIPTION

Figure 1:
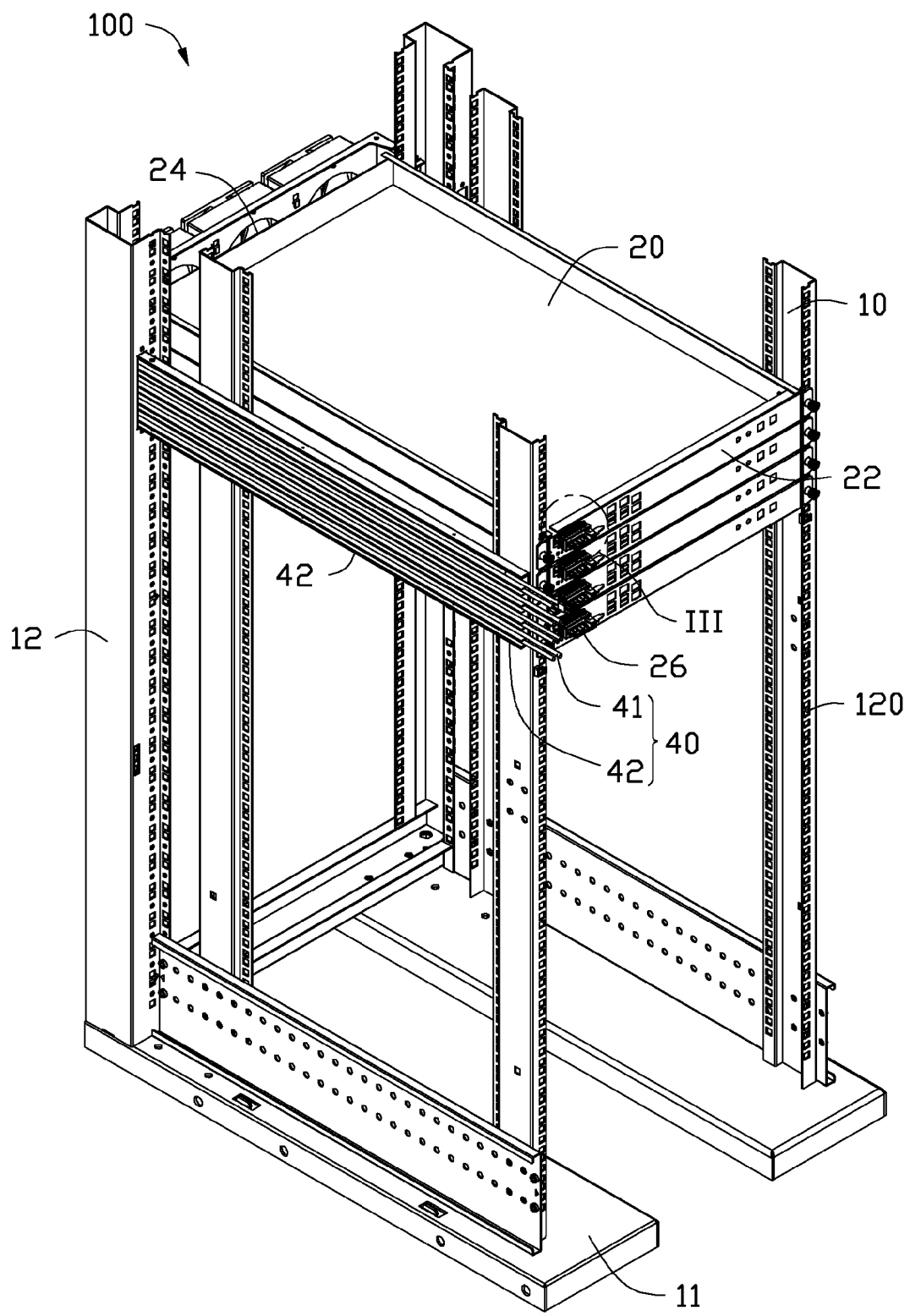
FIG. 1 is a schematic view of a computer system, according to an exemplary embodiment.
Figure 2:
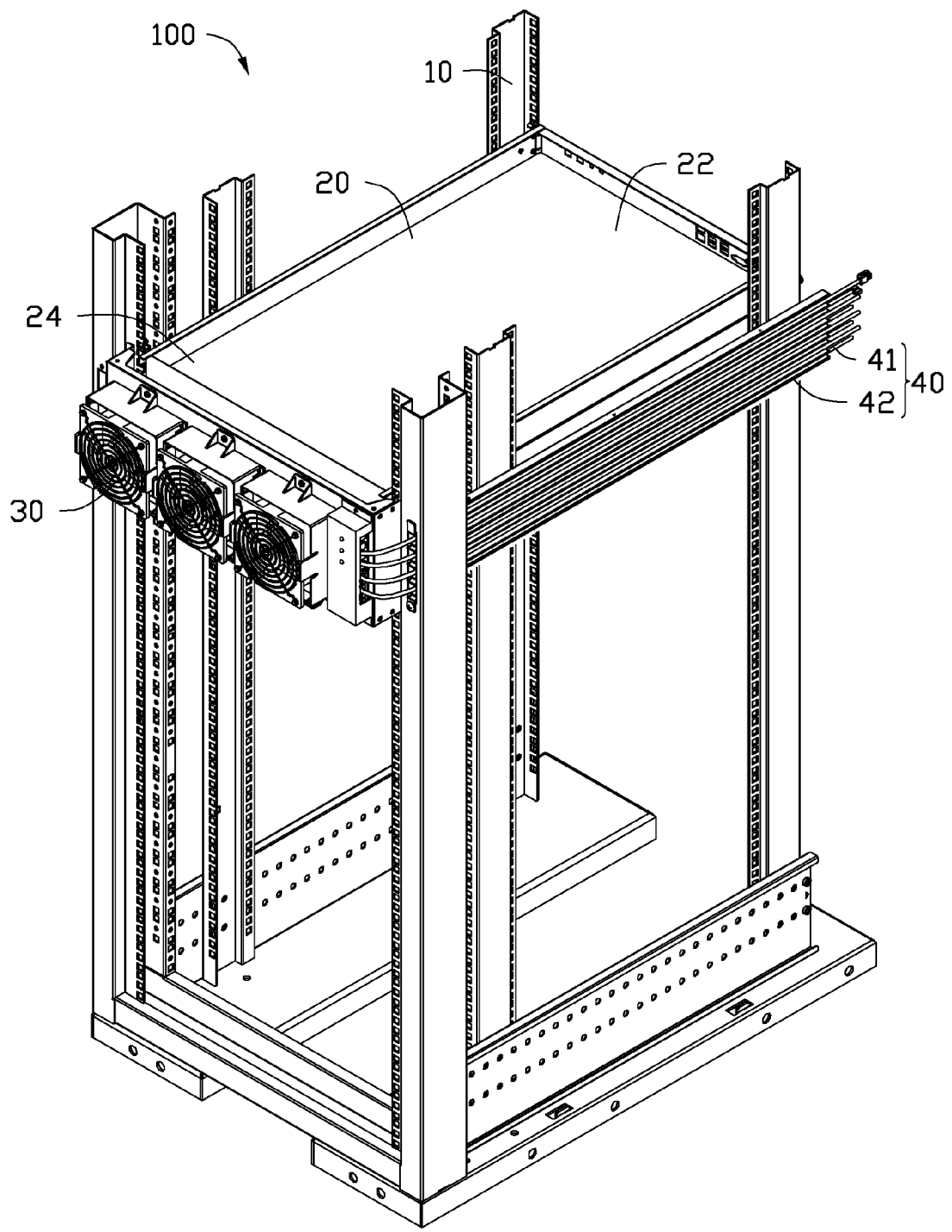
FIG. 2 is similar to FIG. 1, but shown from another direction.

FIGS. 1 and 2 show an apparatus 100, according to an exemplary embodiment. The apparatus 100 can be used in a computer system comprising a plurality of servers to receive the plurality of servers and provide heat dissipation for the plurality of servers. In one embodiment, the apparatus 100 is used in a four-in-one server computer system that includes four servers 20. The apparatus 100 includes a server cabinet 10, a heat dissipation device 30, and a connection element 40. The plurality of servers 20 are all received in the server cabinet 10. The heat dissipation device 30 is mounted on the server cabinet 10 to dissipate heat generated by each of the servers 20. The connection element 40 is mounted on the server cabinet 10 and electrically connected to each server 20 to provide electrical connections (e.g., power and signal connections) to each server 20.

The server cabinet 10 includes at least one base board 11 and a plurality of retaining poles 12. The retaining poles 12 are perpendicularly mounted on the base board 11. Each of the retaining poles 12 defines a number of retaining holes 120. Assembly components, such as screws, bolts, and rivets (not shown), can pass through the retaining holes 120 and be inserted in the servers 20 to retain the servers 20 on the retaining poles 12. In one embodiment, the server cabinet 10 includes two base boards 11 and six retaining poles 12. The two base boards 11 are coplanar and a distance between the two base boards 11 is adjustable. Each base board 11 has three of the six retaining poles 12 perpendicularly mounted thereon.

Figure 3:
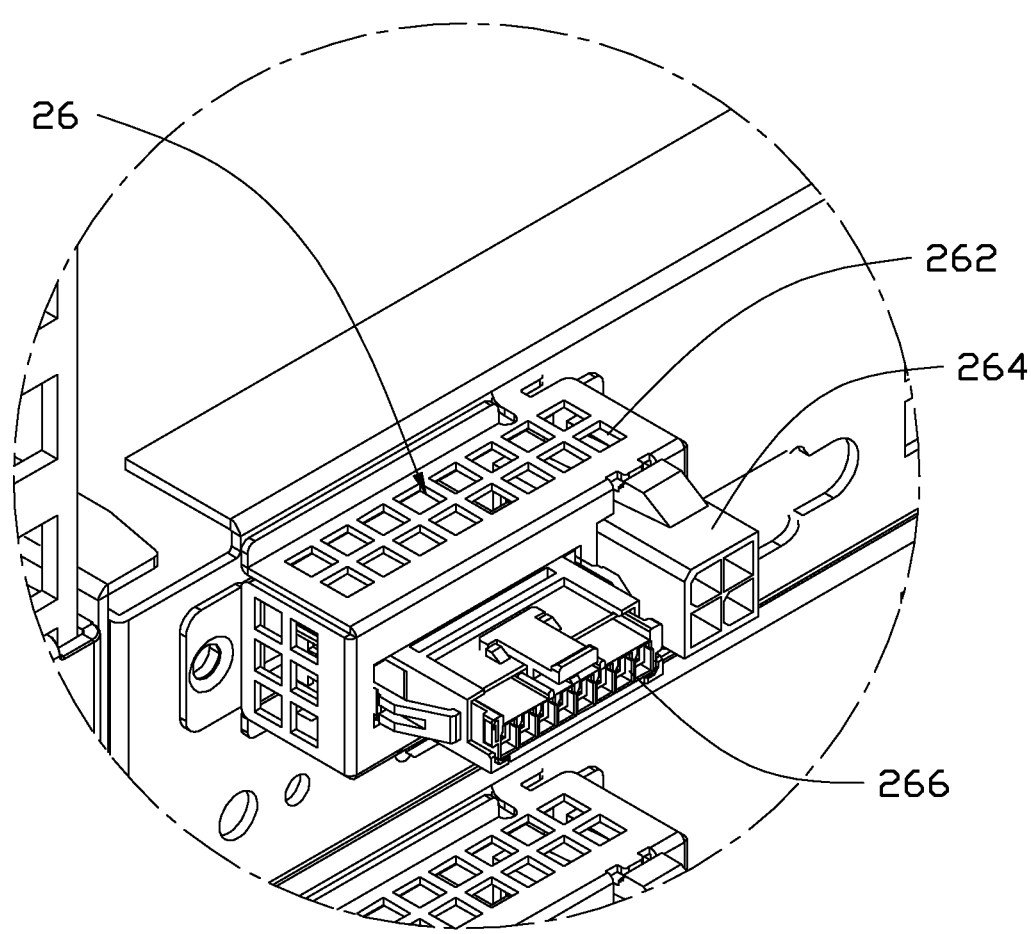
FIG. 3 is an enlarged view of the portion III shown in FIG. 1.

The four servers 20 are all retained on the retaining poles 12, and are positioned at different heights. Each of the servers 20 has a front end 22 and an opposite back end 24, and each includes a connection element 26 mounted on the front end 22. Also referring to FIG. 3, the connection element 26 includes a case 262, a first interface 264, and a second interface 266. The case 262 is fixed on the front end 22 and exposed outside the front end 22. Both the first interface 264 and the second interface 266 are mounted on the case 262, and are electrically connected to a main board (not shown) of the server 20. In one embodiment, the first interface 264 is a power input interface, and the second interface 266 is an intelligent platform management bus (IPMB) interface.

Figure 4:
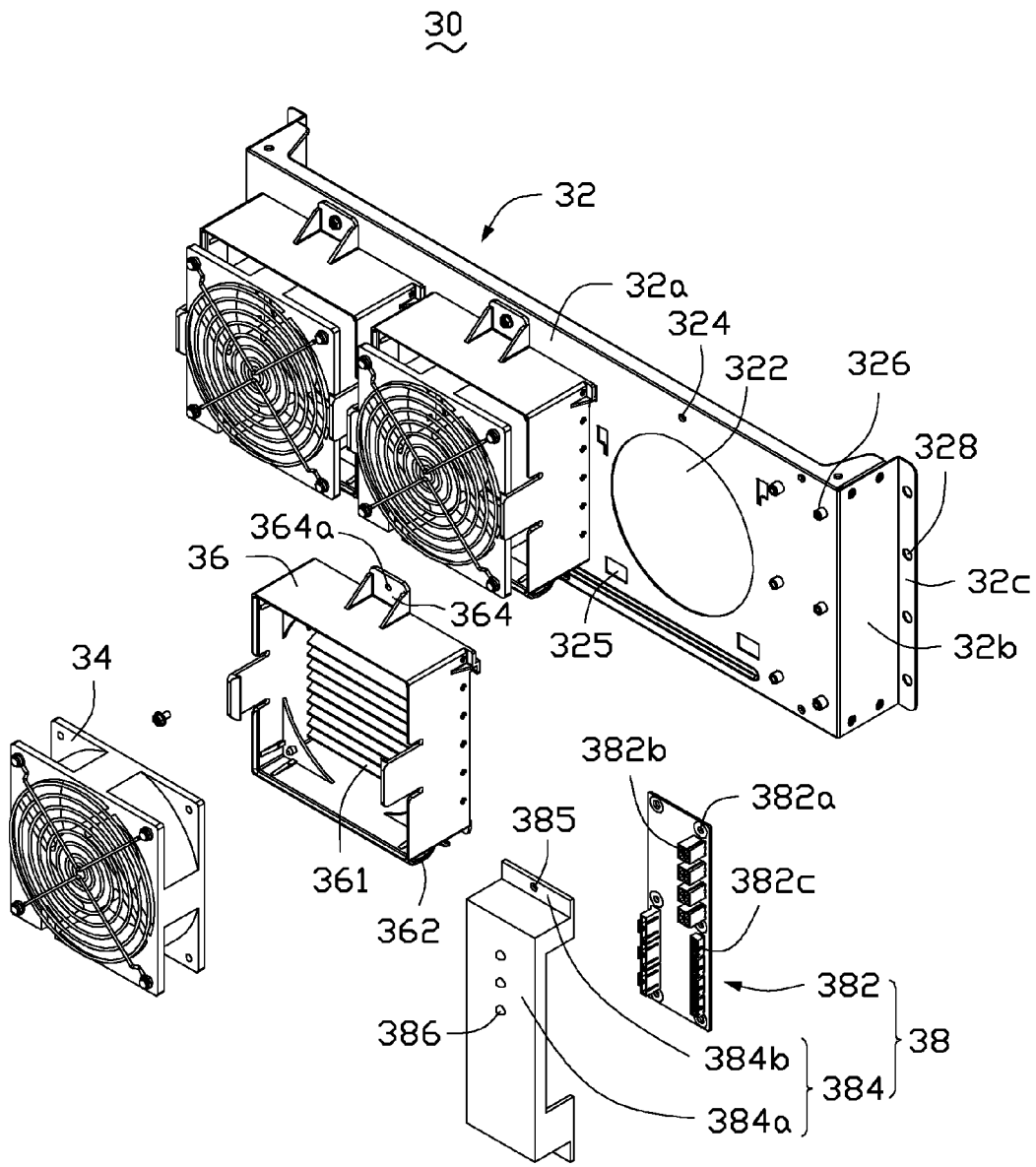
FIG. 4 is a disassembled view of a heat dissipation device of the computer system shown in FIGS. 1 and 2.

Also referring to FIG. 4, the heat dissipation device 30 includes a housing 32, a plurality of fans 34, a plurality of fan holders 36 corresponding to the fans 34, and a control unit 38. In one embodiment, the heat dissipation device 30 includes three fans 34 and thus three fan holder 36.

The housing 32 includes a main body 32a, two holding bodies 32b, and two assembly bodies 32c. The main body 32a is substantially a rectangular board, and defines a plurality of heat dissipation holes 322, a plurality of first holding holes 324, and a plurality of latching holes 325. Shapes and sizes of the heat dissipation holes 322 correspond to that of the fans 34. The first holding holes 324 and the latching holes 325 surround each of the heat dissipation holes 322. The first holding holes 324 can be common screw holes or rivet holes, and the latching holes 325 can be apertures for holding latching hooks. The housing 32 further includes a plurality of connection poles 326 perpendicularly protruding from a planar surface thereof.

The two holding bodies 32b are substantially rectangular boards, and are respectively perpendicularly connected to two ends of the main body 32a. In one embodiment, both the two holding bodies 32b are perpendicularly connected to the same planar surface of the main body 32a that is opposite to the planar surface of the main body 32a from which the connection poles 326 protrude. The two assembly bodies 32c are substantially rectangular boards. Each of the two assembly bodies 32c is perpendicularly connected to one of the two holding bodies 32b, and is substantially parallel to the main body 32a. Furthermore, each of the two assembly bodies 32c defines a plurality of second holding holes 328 configured as a means of attachment between the housing 32 and one of the servers 20.

Each of the fan holders 36 is substantially a cuboid box and can receive a fan 34. Each fan holder 36 includes a number of airflow vanes 361, at least one latching hook 362, and at least one holding flange 364. The airflow vanes 361 are formed on a bottom wall of the fan holder 36. When a fan 34 is received in a fan holder 36, the airflow vanes 361 are aligned with the fan 34. The at least one latching hook 362 and the at least one holding flange 364 are formed on an outside surface of the fan holder 36. Each latching hook 362 corresponds to a latching hole 325, and can be inserted into and be held in the latching hole 325. Each holding flange 364 defines at least one third holding hole 364a corresponding to one of the first holding holes 324.

The control unit 38 includes a circuit board 382, a shielding cover 384, and a plurality of indication lamps 386. The circuit board 382 includes a plurality of connection holes 382a, a plurality of third interfaces 382b, and a plurality of fourth interfaces 382c. The connection holes 382a correspond to the connection poles 326. In one embodiment, the circuit board 382 includes four third interfaces 382b and four fourth interfaces 382c, which correspond to the servers. The third interfaces 382b correspond to the first interface 264 of each server 20, and the fourth interfaces 382c correspond to the second interface 266 of each server 20. The shielding cover 384 is substantially a cuboid box and includes a cover body 384a and at least two assembly flanges 384b connected to two opposite ends of the cover body 384a. Each assembly flange 384b defines a fourth holding hole 385, and each fourth holding hole 385 corresponds to one of the first holding holes 324. In one embodiment, the control unit 38 includes three indication lamps 386. The indication lamps 386 are all electrically connected to the circuit board 382, and each of the indication lamps 386 is dedicated to one of the fans 34.

The connection element 40 includes a plurality of cables 41 and a wire frame 42. The cables 41 are respectively electrically connected to the servers 20 and are all received in the wire frame 42. The servers 20 can obtain electrical connections (e.g., power and signal connections) via the cables 41.

In assembly, each fan 34 is received in a fan holder 36 and is aligned with the airflow vanes 361. The airflow vanes 361 of each fan holder 36 are aligned with one of the heat dissipation holes 322. The latching hooks 362 of the fan holder 36 are inserted into and are held in latching holes 325, adjacent to the heat dissipation hole 322. A fastening element (not shown), such as a screw or bolt or rivet, runs through the third holding hole 364a and the first holding hole 324, corresponding to the third holding hole 364a. In this way, the fan holders 36 with the fans 34 received therein are mounted to the housing 32. The connection poles 326 are inserted into the connection holes 382a to mount the circuit board 382 on the housing 32. The fans 34 are all electrically connected to the circuit board 382, and the circuit board 382 can control each fan 34 to be turned on and off and adjust a rotation speed of the fan 34. The shielding cover 384 covers the circuit board 382. Fastening elements (not shown), such as screws or bolts or rivets, run through each fourth holding hole 385 and the first holding hole 324 corresponding to the fourth holding hole 385 to mount the shielding cover 384 on the housing 32. The three indication lamps 386 are electrically connected to the three fans 34 via the circuit board 382 to indicate the workings status of each of the three fans 34.

The heat dissipation device 30 is thus attached to the server cabinet 10. The heat dissipation holes 322 are aligned with standard openings (not shown) of the servers 20. In one embodiment, for enabling each fan 34 to simultaneously dissipate heat generated by all servers 20 and further dissipate heat generated in the overall server cabined 10, a diameter of each heat dissipation hole 322 is equal to or greater than a sum of thicknesses of all of the servers 20, such that each heat dissipation hole 322 is capable of being aligned with standard openings (not shown) of all servers 20, simultaneously, and is further being capable aligned with the position at the server cabinet 10 for mounting all the servers 20. Thus, airflow generated by each fan 34 can simultaneously enter all servers 20 and flow through outsides of all servers 20 via the heat dissipation hole 322 corresponding to the fan 34. It can collect and dissipate heat generated in all servers 20 and the overall server cabinet 10. The second holding holes 328 are aligned with the adjacent retaining holes 120. Fastening elements (not shown), such as screws or bolts or rivets, run through each second holding hole 328 and the retaining hole 120 corresponding to the second holding hole 328 to mount the heat dissipation device 30 on the retaining holes 120. The third interfaces 382b are electrically connected to the first interfaces 264, and the fourth interfaces 382c are electrically connected to the second interfaces 266.

In use, the servers 20 obtain electrical connections (e.g., power and signal connections) via the cables 41 and work in a normal manner. At the same time, each server 20 provides electrical power to all of the fans 34 via the first interface 264 of the server 20, the third interface 382b corresponding to the first interface 264 of the server 20, and the circuit board 382. Therefore, even if only one of the four servers 20 is working normally, all of the fans 34 can rotate. When each fan 34 rotates, airflow generated by the fan 34 drives the airflow vanes 361 of the fan holder 36 receiving the fan 34 to rotate open, and the airflow passes through each of the servers 20 via the heat dissipation hole 322 corresponding to the fan 34 to dissipate heat generated in each of the servers 20. If any one of the fans 34 is turned off or malfunctions, the airflow vanes 361 of the fan holder 36 holding the fan 34 are closed because of the lack of airflow from the fan 34. In this way, airflow generated by other normally working fans 34 is prevented from recirculating through the heat dissipation hole 322 corresponding to a turned-off or malfunctioning fan 34 and from adversely affecting overall heat dissipation of the servers 20. The indication lamps 386 indicate working status of each of the fans 34.

Furthermore, the circuit board 382 can be electrically connected to a temperature detection element (e.g., a thermistor) of each server 20 via the fourth interface 382c, corresponding to the server 20 and the second interface 266 of the server 20. Thus, the circuit board 382 can detect a temperature inside each server 20, and accordingly turn on or turn off each fan 34 and adjust the rotation speed of each fan 34.

In the apparatus 100, all of the servers 20 share the one heat dissipation device 30. The apparatus 100 does not need to install an exclusive fan for each server 20, which is advantageous in decreasing cost and conserving electrical power. Furthermore, because the heat dissipation device 30 is outside the servers 20, and mounted on an exterior surface, the heat dissipation device 30 and each of the fans 34 can easily be detached from and reassembled to the apparatus 100.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An apparatus comprising:
a server cabinet capable of receiving a plurality of servers therein; and
a heat dissipation device mounted on the server cabinet;
wherein the heat dissipation device includes a plurality of fans and a housing, the housing defining a plurality of heat dissipation holes corresponding to the plurality of fans, a diameter of each heat dissipation hole equal to or greater than a sum of thicknesses of all of the servers, each heat dissipation hole aligned with all of the servers, and each of the plurality of fans is configured to dissipate heat generated in the server cabinet.

2. The apparatus of claim 1, wherein the server cabinet includes at least one base board and a plurality of retaining poles, the plurality of retaining poles are perpendicularly mounted on the at least one base board, and the heat dissipation device is mounted on the plurality of retaining poles.

3. The apparatus of claim 2, wherein the server cabinet includes two base boards, the plurality of retaining poles are respectively perpendicularly mounted on the two base boards, and a distance between the two base boards is adjustable.

4. The apparatus of claim 2, wherein the heat dissipation device further includes a plurality of fan holders corresponding to the plurality of fans, each of the plurality of fans is received in a corresponding one of the plurality of fan holders, the plurality of fan holders are all mounted on the housing, and the housing is mounted on the plurality of retaining poles.

5. The apparatus of claim 4, wherein each of the plurality of fan holders includes a airflow vanes, each fan is aligned with the airflow vanes of the corresponding fan holder receiving the fan, and wind generated by the fan is capable of driving the airflow vanes to open when the fan rotates.

6. The apparatus of claim 5, wherein the plurality of heat dissipation holes is corresponding to the plurality of fan holders, and the airflow vanes of each of the plurality fan holders are aligned with a corresponding one of the plurality of heat dissipation holes.

7. The apparatus of claim 6, wherein airflow generated by each of the plurality of fans is capable of simultaneously entering all of the plurality of servers and flow through outsides of all of the plurality of servers via the one of the heat dissipation holes corresponding to the fan.

8. The apparatus of claim 4, wherein the heat dissipation device further includes a control unit mounted on the housing, and the control unit includes a circuit board electrically connected to each of the plurality of fans.

9. The apparatus of claim 8, wherein the circuit board is further electrically connected to each of the plurality of servers, and each of the plurality of servers provides electrical power to each of the plurality of fans via the circuit board.

10. The apparatus of claim 8, wherein the circuit board is configured to detect a temperature inside each of the plurality of servers, determine whether each fan is turned on or turned off, and adjust the rotation speed of each fan according to the temperatures inside the plurality of servers.

11. The apparatus of claim 8, wherein the control unit further includes a plurality of indication lamps corresponding to the plurality of fans, and the plurality of indication lamps are respectively electrically connected to the plurality of fans via the circuit board to indicate workings statuses of the plurality of fans.

12. The apparatus of claim 8, further comprising a connection element; wherein the connection element includes a plurality of cables and a wire frame, the plurality of cables are respectively electrically connected to the plurality of servers to provide electric connections to the plurality of servers, and are all received in the wire frame.

13. An apparatus, comprising:
a server cabinet capable of receiving at least one group of server therein, the servers in a group being positioned at different heights; and
a heat dissipation device mounted on the server cabinet;
wherein the heat dissipation device comprises at least one group of fans and a housing, the housing defining at least one group of heat dissipation holes to receiving the fans, a diameter of each heat dissipation hole in a group equal to or greater than a sum of thicknesses of all of the servers in a corresponding group, each fan received in corresponding group of heat dissipation hole aligned with all of the servers in the corresponding group to dissipate heat generated in the server cabinet.

* * * * *